(12) United States Patent
Lee

(10) Patent No.: US 11,811,096 B2
(45) Date of Patent: Nov. 7, 2023

(54) FLEXIBLE BATTERY AND ELECTRONIC DEVICE INCLUDING THE SAME

(71) Applicant: Samsung Electronics Co., Ltd., Gyeonggi-do (KR)

(72) Inventor: Yeonil Lee, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 584 days.

(21) Appl. No.: 16/935,342

(22) Filed: Jul. 22, 2020

(65) Prior Publication Data

US 2021/0028433 A1 Jan. 28, 2021

(30) Foreign Application Priority Data

Jul. 23, 2019 (KR) ........................ 10-2019-0089046

(51) Int. Cl.
*H01M 50/531* (2021.01)
*H01M 50/109* (2021.01)
(Continued)

(52) U.S. Cl.
CPC ..... *H01M 50/531* (2021.01); *H01M 10/0585* (2013.01); *H01M 10/425* (2013.01);
(Continued)

(58) Field of Classification Search
CPC ............. H01M 50/531; H01M 50/486; H01M 50/109; H01M 50/545; H01M 50/119;
(Continued)

(56) References Cited

U.S. PATENT DOCUMENTS

| 5,227,267 A | 7/1993 | Goebel et al. |
| 8,202,641 B2 | 6/2012 | Winter et al. |

(Continued)

FOREIGN PATENT DOCUMENTS

| CN | 106374561 A | 2/2017 |
| CN | 109361010 A | 2/2019 |

(Continued)

OTHER PUBLICATIONS

KR20170019332 MT (Year: 2017).*
International Search Report dated Nov. 6, 2020.

*Primary Examiner* — Alexander Usyatinsky
(74) *Attorney, Agent, or Firm* — Cha & Reiter, LLC

(57) ABSTRACT

A battery and an electronic device are disclosed. The battery is component to the electronic device, and includes: a first cathode plate including a first surface oriented in a first direction, and a second surface oriented in a second direction opposite to the first direction, a first separation membrane disposed on the second surface of the first cathode plate, a first anode plate disposed on a surface of the separation membrane oriented in the second direction, a through hole formed adjacent to respective center portions of the first cathode plate, the first separation membrane, and the first anode plate, wherein the through hole is substantially perpendicular to one surface of the first cathode plate, a cathode tab disposed within the through hole and electrically connected to the first cathode plate, and an anode tab spaced apart from the cathode plate within the through hole and electrically connected to the first anode plate, wherein the cathode tab and the anode tab are at least partially exposed to an external environment through the through hole.

10 Claims, 15 Drawing Sheets

(51) Int. Cl.
  *H01M 10/42* (2006.01)
  *H05K 5/00* (2006.01)
  *H05K 7/14* (2006.01)
  *H01M 10/0585* (2010.01)
  *H01M 50/119* (2021.01)
  *H01M 50/486* (2021.01)
  *H01M 50/545* (2021.01)

(52) U.S. Cl.
  CPC ....... *H01M 50/109* (2021.01); *H01M 50/119* (2021.01); *H01M 50/486* (2021.01); *H01M 50/545* (2021.01); *H05K 5/0086* (2013.01); *H05K 7/1427* (2013.01); *H01M 2220/30* (2013.01)

(58) Field of Classification Search
  CPC ........... H01M 10/0585; H01M 10/425; H01M 2220/30; H05K 5/0086; H05K 7/1427
  See application file for complete search history.

(56) References Cited

U.S. PATENT DOCUMENTS

| | | |
|---|---|---|
| 8,209,557 B2 | 6/2012 | Lin et al. |
| 8,450,001 B2 | 5/2013 | Kell et al. |
| 8,535,828 B2 | 9/2013 | Byun et al. |
| 8,673,485 B2 | 3/2014 | Yamazaki et al. |
| 8,758,931 B2 * | 6/2014 | Yebka ..................... B60L 58/14 |
| | | 429/61 |
| 9,017,859 B2 | 4/2015 | Yeh |
| 2002/0192559 A1 * | 12/2002 | Yoshimura .......... H01M 50/562 |
| | | 429/231.1 |
| 2006/0099504 A1 * | 5/2006 | Kim .................. H01M 10/0587 |
| | | 29/623.1 |
| 2008/0305391 A1 * | 12/2008 | Hirose ................ H01M 10/052 |
| | | 429/188 |
| 2011/0281147 A1 | 11/2011 | Sun et al. |
| 2013/0130087 A1 | 5/2013 | Kawaguchi et al. |
| 2013/0136967 A1 | 5/2013 | Bhardwaj et al. |
| 2014/0113184 A1 * | 4/2014 | Hamel ............. H01M 10/0436 |
| | | 429/163 |

FOREIGN PATENT DOCUMENTS

| | | |
|---|---|---|
| JP | 2000-340265 A | 12/2000 |
| JP | 2011-81941 A | 4/2011 |
| KR | 10-1085938 B1 | 11/2011 |
| KR | 10-1181788 B1 | 9/2012 |
| KR | 10-2013-0105272 A | 9/2013 |
| KR | 10-1588930 B1 | 1/2016 |
| KR | 10-2017-0019332 A | 2/2017 |
| KR | 20170019332 * | 2/2017 |
| KR | 10-2124945 B1 | 6/2020 |

\* cited by examiner

FLEXIBLE BATTERY AND ELECTRONIC DEVICE INCLUDING THE SAME

CROSS-REFERENCE TO RELATED APPLICATION(S)

This application is based on and claims priority under 35 U.S.C. 119 to Korean Patent Application No. 10-2019-0089046, filed on Jul. 23, 2019, in the Korean Intellectual Property Office, the disclosure of which is herein incorporated by reference in its entirety.

BACKGROUND

1) Field

Certain embodiments relate to a flexible battery and an electronic device including the same.

2) Description of Related Art

An electrode plate of a battery may include current collector tabs disposed at opposite ends thereof, or near to an edge region. A wound battery may include one or more current collector tabs on one electrode plate. A stacked battery may include a plurality of electrode plates, each of which has a current collector tab. The stacked structure may include a relatively large number of tabs and a small area of the electrode plates, and may have a low electrode resistance. The characteristics of the electrode resistance often greatly affect battery performance.

The stacked battery may be manufactured by stacking a plurality of electrode plates and a plurality of separation membranes. Since it is necessary for the plurality of electrode plates and the plurality of separators to be disposed in the same area, the electrode plates and separators are aligned during manufacture.

The above information is presented as background information only to assist with an understanding of the disclosure. No determination has been made, and no assertion is made, as to whether any of the above might be applicable as prior art with regard to the disclosure.

SUMMARY

In general, as the capacity of a battery increases, the area of an electrode plate increases. When the area of the electrode plate increases, the electrode resistance may increase as well. When a current collector tab is formed on one side of the electrode plate, and the area of the electrode plate is increased, the distance that electrons generated on the opposite side of the electrode plate must travel in order to reach the current collector tab increase, and as a result, electrode resistance increases. The increased electrode resistance causes a relative loss of potentially battery power, thereby reducing the usability of the battery. When the electrode resistance is sufficiently large, a voltage drop (IR drop) may occur depending on the magnitude of current. As a consequence, a high-rate charging or discharging characteristic (i.e., rapid charging and rapid discharging) may deteriorate.

Recently, there has been increasing demand for high capacity and rapid charging and discharging batteries in multiple fields, including mobile communications and electric vehicles. Thus, as noted above, when an area of a battery is increased, the surface resistance is increased. This occurs not only in batteries having wound structures, but also in stacked structure batteries which traditionally have a relatively lower resistance due to the large number of applied current collector tabs. As a result, large power losses may be caused due to the structure and positions of the tabs.

According to certain embodiments disclosed herein, to the present disclosure provides a battery having a low-resistance electrode structure.

According to certain embodiments, a battery may include: a first cathode plate including a first surface oriented in a first direction, and a second surface oriented in a second direction opposite to the first direction, a first separation membrane disposed on the second surface of the first cathode plate, a first anode plate disposed on a surface of the separation membrane oriented in the second direction, a through hole formed adjacent to respective center portions of the first cathode plate, the first separation membrane, and the first anode plate, wherein the through hole is substantially perpendicular to one surface of the first cathode plate, a cathode tab disposed within the through hole and electrically connected to the first cathode plate, and an anode tab spaced apart from the cathode plate within the through hole and electrically connected to the first anode plate, wherein the cathode tab and the anode tab are at least partially exposed to an external environment through the through hole.

According to certain embodiments, a battery may include: a first cathode plate including a first surface oriented in a first direction and a second surface oriented in a second direction opposite to the first direction, a separation membrane disposed on the second surface of the first cathode plate, a first anode plate disposed on a surface of the separation membrane oriented in the second direction, a cathode tab extending from a portion of the first cathode plate in the first direction, and an anode tab extending from a portion of the first anode plate in the first direction, wherein the cathode tab and the anode tab are at least partially exposed to an external environment.

According to certain embodiments, an electronic device is disclosed including: a housing, a printed circuit board disposed within the housing, and including a first surface oriented in a first direction, and a second surface oriented in a second direction opposite to the first direction, a first cathode plate disposed on the second surface of the printed circuit board, a first separation membrane disposed on a surface of the first cathode plate oriented in the second direction, a first anode plate disposed on a surface of the first separation membrane oriented in the second direction, a through hole formed adjacent to respective center portions of the first cathode plate, the first separation membrane, and the first anode plate, wherein the through hole is substantially perpendicular to the first cathode plate, a cathode tab disposed within the through hole and electrically connected to the first cathode plate, and an anode tab spaced apart from the cathode plate within the through hole and electrically connected to the first anode plate, wherein the cathode tab and the anode tab are at least partially exposed to an external environment through the through hole.

According to certain embodiments, a face-centered electrode plate structure capable of reducing power loss caused by resistance inside a battery is disclosed. By locating current collector tabs at the face center (i.e., a center portion) at which the total resistance is minimized due to the small sum of paths when summing the resistance components from the unit areas of respective electrode plates to the current collector tabs, it is possible to minimize power loss.

A battery including an alignment member is proposed in order to ensure stable stacking of a plurality of electrode plates. By using an alignment member, it is possible to prevent a cathode current collector tab (hereinafter, referred to as a "cathode tab") disposed in the centers of the electrode plates from interfering with an anode current collector tab (hereinafter referred to as an "anode tab") disposed in the centers of the electrode plates. Through this, while implementing a high-capacity battery, safety problems such as battery smoke and ignition due to an electric short circuit can be prevented. When the electrode resistance is small, it is easy to manage the battery temperature because the heat generation of the battery during charging and discharging of the battery is small.

By adopting a structure in which current collector tabs are disposed on the face centers of the electrode plates, the electrode plates are bidirectionally deformable in both of X-axis and Y-axis directions, as well as in a single direction. When the resistance of the electrode plates against stress applied by bidirectional bending in the X-axis and Y-axis directions is increased, the flexible characteristics of the battery can be improved. In addition, when manufacturing a stacked battery, alignment of the electrode plates can be more easily and efficiently performed.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
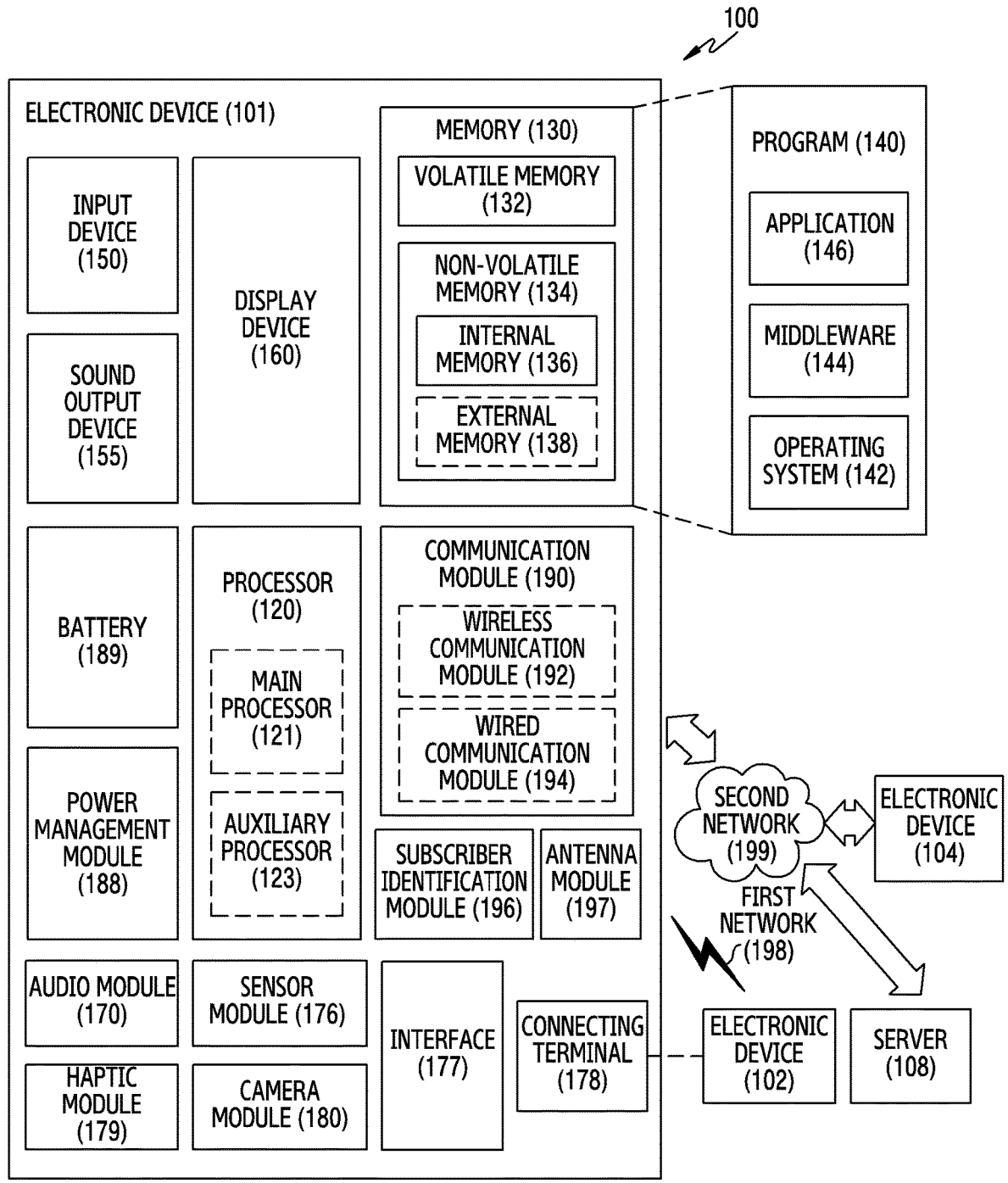
FIG. 1 is a block diagram of an electronic device according to certain embodiments in a network environment.

FIG. 1 is a block diagram illustrating an electronic device 101 in a network environment 100 according to certain embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
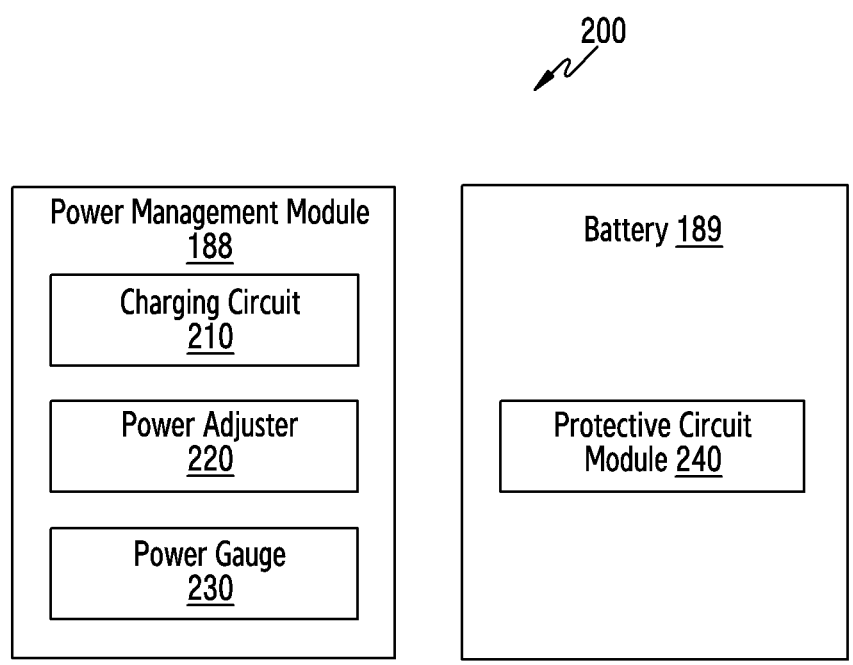
FIG. 2 is a block diagram illustrating a power management module and a battery according to certain embodiments.

FIG. 2 is a block diagram 200 illustrating the power management module 188 and the battery 189 according to certain embodiments. Referring to FIG. 2, the power management module 188 may include charging circuitry 210, a power adjuster 220, or a power gauge 230. The charging circuitry 210 may charge the battery 189 by using power supplied from an external power source outside the electronic device 101. According to an embodiment, the charging circuitry 210 may select a charging scheme (e.g., normal charging or quick charging) based at least in part on a type of the external power source (e.g., a power outlet, a USB, or wireless charging), magnitude of power supplied from the external power source (e.g., about 20 Watt or more), or an attribute of the battery 189, and may charge the battery 189 using the selected charging scheme. The external power source may be connected with the electronic device 101, for example, directly via the connecting terminal 178 or wirelessly via the antenna module 197.

The power adjuster 220 may generate a plurality of powers having different voltage levels or different current levels by adjusting a voltage level or a current level of the power supplied from the external power source or the battery 189. The power adjuster 220 may adjust the voltage level or the current level of the power supplied from the external power source or the battery 189 into a different voltage level or current level appropriate for each of some of the components included in the electronic device 101. According to an embodiment, the power adjuster 220 may be implemented in the form of a low drop out (LDO) regulator or a switching regulator. The power gauge 230 may measure use state information about the battery 189 (e.g., a capacity, a number of times of charging or discharging, a voltage, or a temperature of the battery 189).

The power management module 188 may determine, using, for example, the charging circuitry 210, the power adjuster 220, or the power gauge 230, charging state information (e.g., lifetime, over voltage, low voltage, over current, over charge, over discharge, overheat, short, or swelling) related to the charging of the battery 189 based at least in part on the measured use state information about the battery 189. The power management module 188 may determine whether the state of the battery 189 is normal or abnormal based at least in part on the determined charging state information. If the state of the battery 189 is determined to abnormal, the power management module 188 may adjust the charging of the battery 189 (e.g., reduce the charging current or voltage, or stop the charging). According to an embodiment, at least some of the functions of the power management module 188 may be performed by an external control device (e.g., the processor 120).

The battery 189, according to an embodiment, may include a protection circuit module (PCM) 240. The PCM 240 may perform one or more of various functions (e.g., a pre-cutoff function) to prevent a performance deterioration of, or a damage to, the battery 189. The PCM 240, additionally or alternatively, may be configured as at least part of a battery management system (BMS) capable of performing various functions including cell balancing, measurement of battery capacity, count of a number of charging or discharging, measurement of temperature, or measurement of voltage.

According to an embodiment, at least part of the charging state information or use state information regarding the battery 189 may be measured using a corresponding sensor (e.g., a temperature sensor) of the sensor module 176, the power gauge 230, or the power management module 188. According to an embodiment, the corresponding sensor (e.g., a temperature sensor) of the sensor module 176 may be included as part of the PCM 240, or may be disposed near the battery 189 as a separate device.

Figure 3:
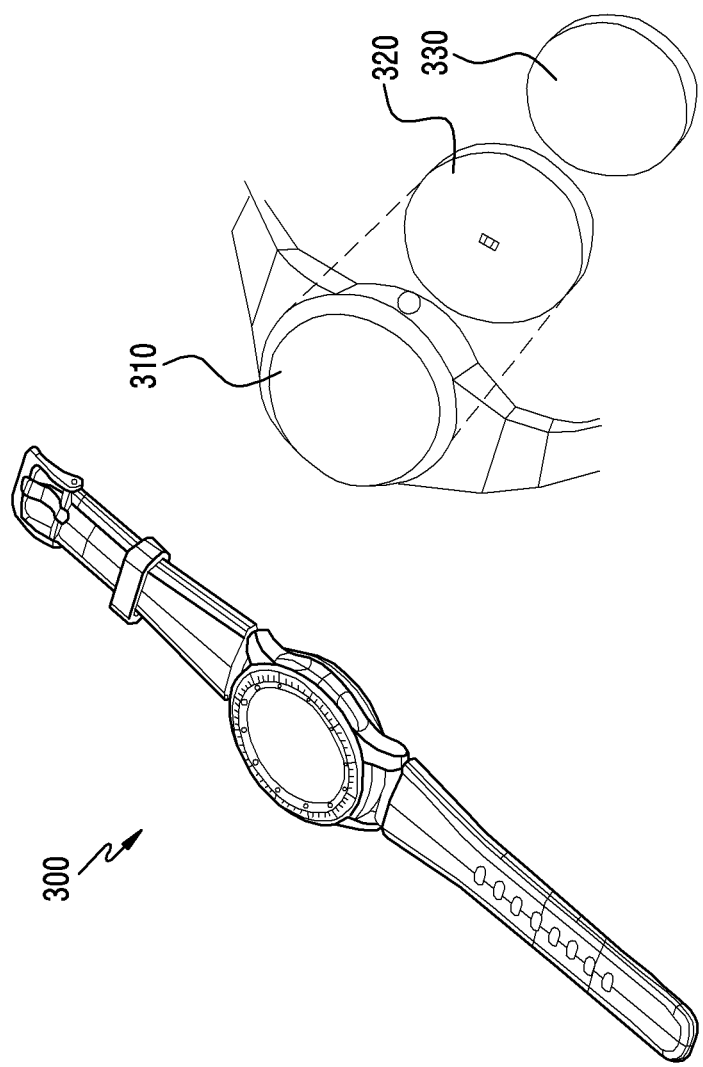
FIG. 3 is a view illustrating a wearable electronic device according to certain embodiments.

FIG. 3 is a view illustrating a wearable electronic device according to certain embodiments.

Referring to FIG. 3, an electronic device 300 may include a housing 310, a printed circuit board 330 within the housing 310, and a battery 320 within the housing 310.

A processor (e.g., the processor 120 in FIG. 1), memory (e.g., the memory 130 in FIG. 3), and/or an interface (e.g., the interface 177 in FIG. 1) may be mounted on the printed circuit board 330. The processor may include, for example, one or more of a central processing unit, an application processor, a graphics processing unit (GPU), a sensor processor, or a communication processor.

The battery 320 is a device for supplying power to at least one component of the electronic device 300, and may include, for example, a non-rechargeable primary battery, a rechargeable secondary battery, or a fuel cell. According to certain embodiments, the battery 320 may be disposed on one surface of the printed circuit board 330. As another example, at least part of the battery 320 may be disposed on substantially the same plane as, for example, the printed circuit board 330. The battery may be integrally disposed inside the electronic device, or may be detachably mounted on the electronic device.

According to certain embodiments, the electronic device 300 may a wearable device. The battery 320 and the printed circuit board 330 may be formed in a circular shape, and the battery 320 may be bent when the wearable device is bent.

Figure 4A:
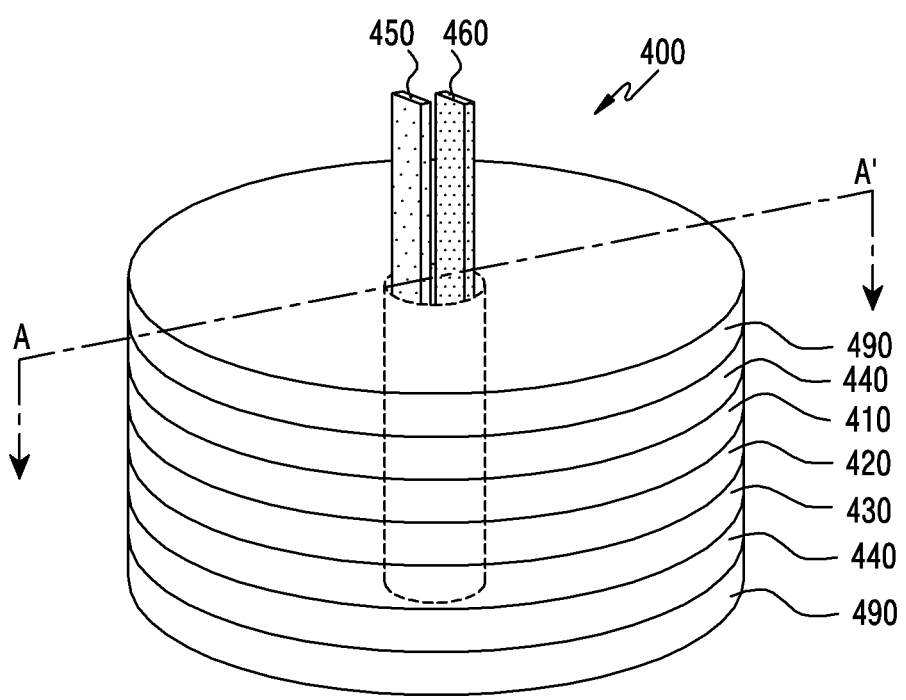
FIG. 4A is a view illustrating a battery having a current collector disposed in the center portion of an electrode plate according to certain embodiments.
Figure 4B:
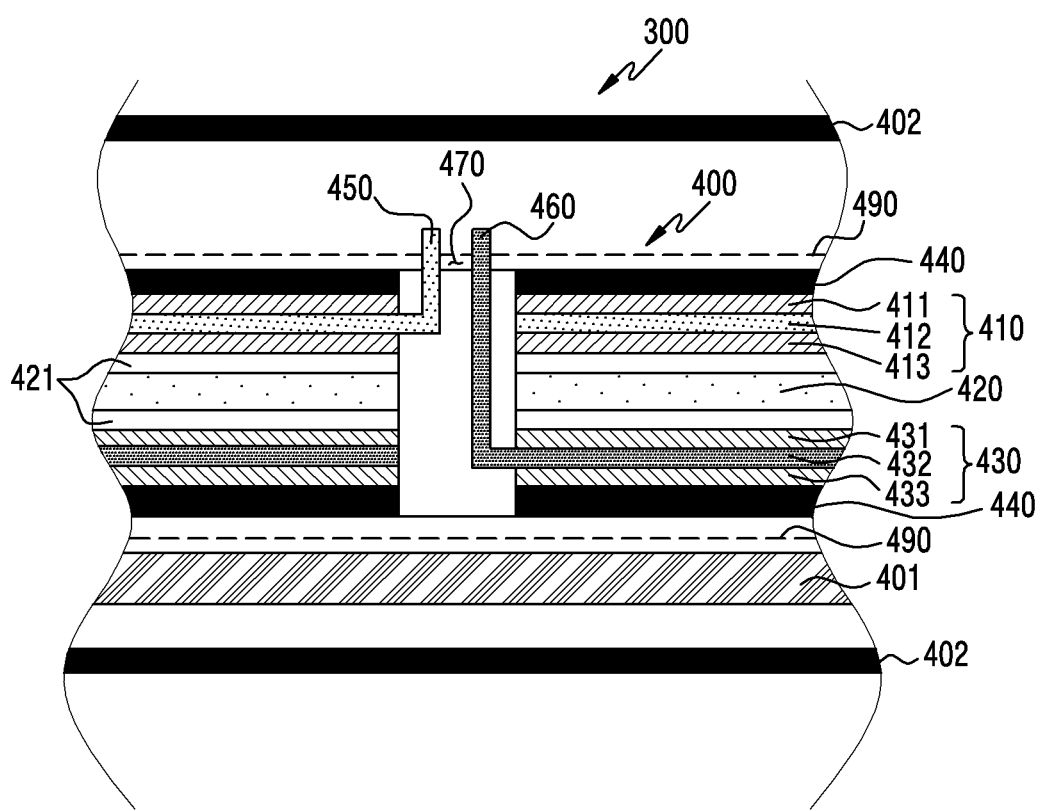
FIG. 4B is a cross-sectional view illustrating a battery having a current collector disposed in the center portion of an electrode plate according to certain embodiments.
Figure 4C:
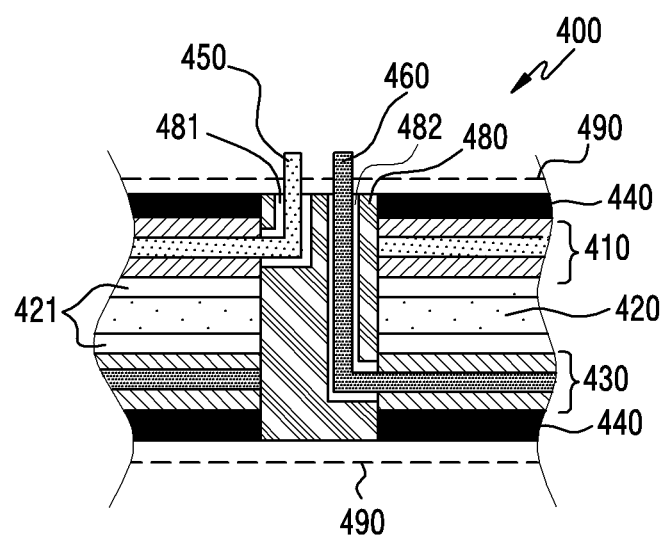
FIG. 4C is a cross-sectional view of a battery including an alignment member according to certain embodiments.
Figure 4D:
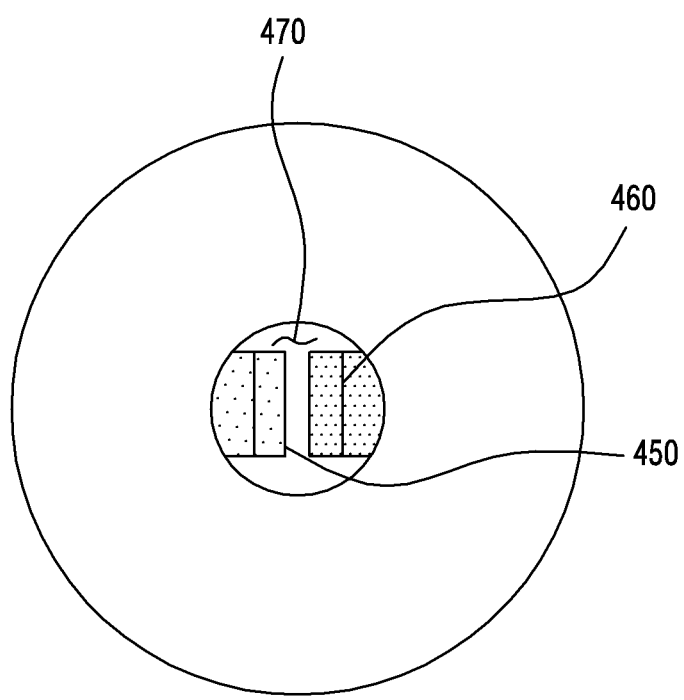
FIG. 4D is a top plan view illustrating a battery having a current collector disposed in the center portion of an electrode plate according to certain embodiments.
Figure 5:
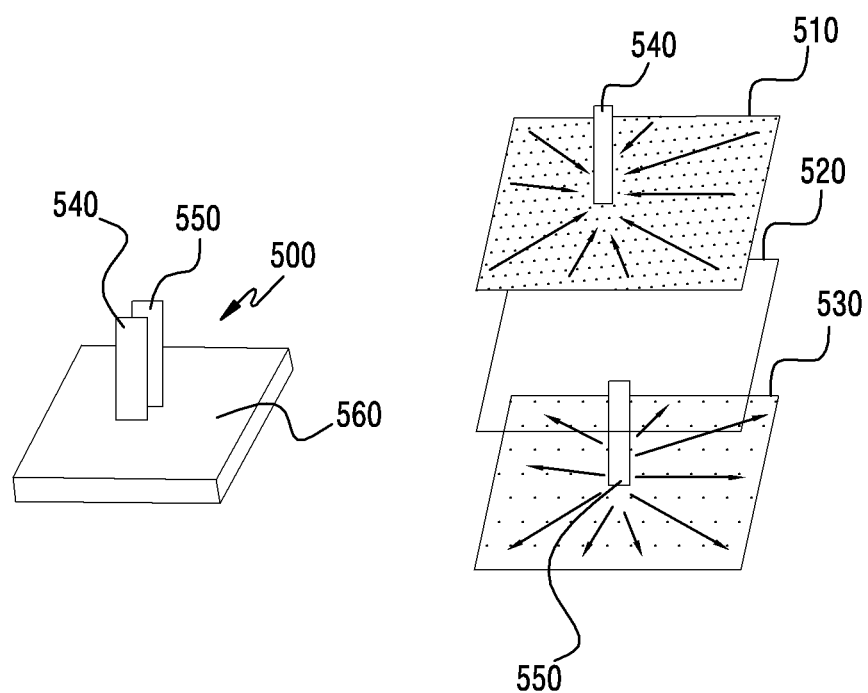
FIG. 5 is a view illustrating the flow of electrons in electrode plates during discharging of a battery.
Figure 6A:
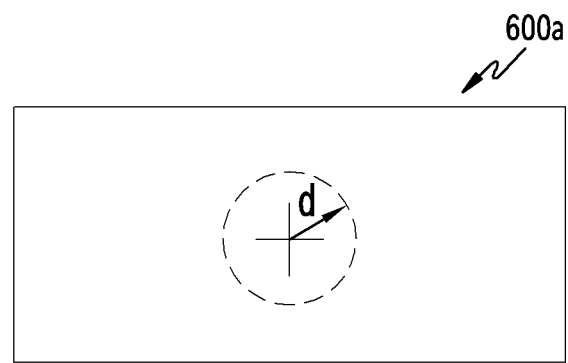
FIG. 6A is a view illustrating the face center of an electrode in which a current collector according to certain embodiments is disposed.
Figure 6B:
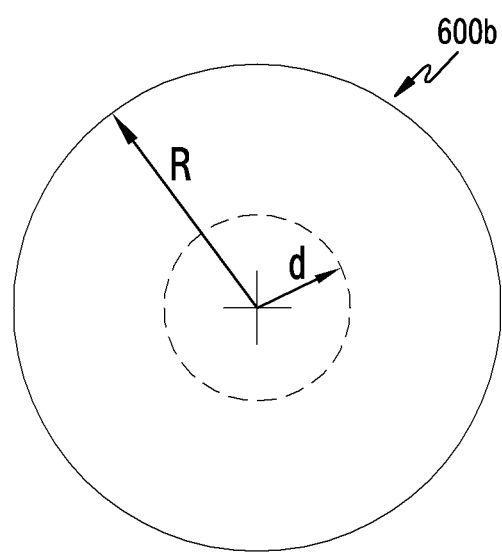
FIG. 6B is a view illustrating the center portion of an electrode plate in which a current collector according to certain embodiments is disposed.

FIG. 4A is a view illustrating an electronic device including a battery having a current collector disposed in the center portion of an electrode plate according to certain embodiments. FIG. 4B is a cross-sectional view illustrating a battery having a current collector disposed in the center portion of an electrode plate. FIG. 4C is a cross-sectional view of a battery including an alignment member. FIG. 4D is a top view of a battery having a current collector disposed in the center portion of an electrode plate. FIG. 5 is a view illustrating the flow of electrons in electrode plates when a battery is discharged. FIG. 6A is a view illustrating the face center of an electrode in which a current collector is disposed, and FIG. 6B is a view illustrating the center portion of an electrode plate in which a current collector is disposed.

Referring to FIGS. 4A and 4B, a battery 400 within a housing 402 of an electronic device (e.g., the electronic device 300 in FIG. 3) includes a pouch 490, a cathode plate 410 within the pouch 490, an anode plate 430 facing the cathode plate 410, a cathode tab 450 extending to the outside of the pouch 490 from the center portion of the cathode plate 410, an anode tab 460 extending to the outside of the pouch 490 from the center portion of the anode plate 430, a separation membrane 420 disposed between the cathode plate 410 and the anode plate 430, an alignment member, and a polymer film (e.g., a PET film) 440 disposed on each of the surfaces of the cathode plate 410 and the anode plate 430 that face the pouch 490. The battery 400 may be electrically connected to the printed circuit board 401.

The cathode plate 410 may include a cathode substrate 412 and a cathode active material 411 disposed on opposite surfaces of the cathode substrate 412. The anode plate 430 may include an anode substrate 432 and an anode active material 431 disposed on opposite surfaces of the anode substrate 432. The material of the cathode substrate 412 may be aluminum. A mixture, in which a cathode active material 411, a conductive agent, and a binder are mixed, may be coated on the cathode substrate 412. The cathode active material 411 may include lithium oxide (e.g., lithium cobalt oxide) or iron iridium phosphate. The conductive agent may increase the conductivity of the active material. The binder may serve as an adhesive that helps the active material and the conductive agent to be fixed well on the substrate. The material of the anode substrate 432 may be copper. A mixture of an anode active material 431, a conductive agent, and a binder may be coated on the anode substrate 432. The anode active material 431 may include at least one of carbon, silicon, and graphite. Graphite is a material having high structural stability, low reactivity, a property capable of storing many lithium ions, and economical efficiency, and may be suitable for use as the anode active material 431.

When the cathode plate 410 and the anode plate 430 come into contact with each other, heat may be generated due to a chemical reaction, which may result in ignition. Thus, the separation membrane 420 may be disposed in order to prevent contact between the cathode plate 410 and the anode plate 430. The separation membrane 420 may be disposed between the cathode plate 410 and the anode plate 430 such that the cathode plate 410 and the anode plate 430 are not brought into contact with each other. The separation membrane 420 may prevent electrons from directly flowing through electrolyte, and may only allow desired ions to pass through micropores therein. The separation membrane 420 may include a synthetic resin such as polyethylene or polypropylene.

The battery may include an electrolyte 421. When charging or discharging the battery, positive ions (e.g., lithium ions) are movable through the electrolyte 421, and electrons are movable through the current collector. The electrolyte is a medium that allows positive ions to move between the cathode plate 410 and the anode plate 430. The electrolyte may be made of a material having high ion conductivity so that lithium ions are sufficiently mobile.

When charging or discharging the battery, electrons may move through the substrate of the cathode plate 410 and the substrate of the anode plate 430. Electrons, transferred from the cathode active material 411 or the anode active material 431 to the substrates of the electrode plates, may be transferred to the current collector tabs. The electrons, transferred from the current collector tabs to the substrates, may be transferred to the cathode active material 411 or the anode active material 431. The current collector tabs may be connected to an electronic device so as to supply power to the electronic device. The cathode tab 450 corresponding to the current collector tab of the cathode plate 410 may extend from the substrate of the cathode plate 410.

Referring to FIG. 4B, the anode tab 460 corresponding to the current collector tab of the anode plate 430 may extend from the substrate of the anode plate 430. The current collector tabs 450 and 460 may extend in a direction perpendicular to the electrode plates 410 and 430. For example, the cathode tab 450 may extend in a horizontal direction from a portion of the substrate of the cathode plate 410 and then extend in a vertical direction. As another example, the cathode tab 450 may extend directly in a vertical direction in a partial region of the substrate of the cathode plate 410. When the current collector tabs 450 and 460 are disposed perpendicular to the electrode plates 410 and 430, the capacity of the battery may be increased. When the current collector tabs 450 and 460 extend in a direction parallel to the electrode plates 410 and 430, the area of each of the electrode plates 410 and 430 may be reduced by the area occupied thereon by the corresponding one of the current collector tabs 450 and 460. On the other hand, when the current collector tabs 450 and 460 extend in a direction perpendicular to the electrode plates 410 and 430, the area occupied thereon by the current collector tabs 450 and 460 can be minimized, so that the area occupied by the electrode plates 410 and 430 can be increased. Accordingly, when the current collector tabs 450 and 460 extend to be perpendicular to the electrode plates 410 and 430, the capacity of the battery is increased.

According to an embodiment, the battery 400 may include an alignment member 480. For example, the cathode plate 410, the separator 420, and the anode plate 430 may include a through hole 470 therein. Referring to FIG. 4C, the battery 400 may include an alignment member 480 disposed in the through hole 470. The alignment member 480 is inserted into the through hole 470, so that the cathode plate 410, the separator 420, and the anode plate 430 can be aligned. For example, in the case where the cathode plate 410, the separator 420, and the anode plate 430 are circular, when the alignment member 480 having a shape corresponding to that of the through hole 470 formed in the circle centers of the cathode plate 410, the separator 420, and the anode plate 430 is used, the cathode plate 410, the separation membrane 420, and the edge of the anode plate 430 may be aligned such that the edges thereof coincide with each other. The alignment member 480 may include a first cavity 481 and a second cavity 482. The first cavity 481 and the second cavity 482 may be formed such that they do not share the same space with each other. The first cavity 481 may accommodate the cathode tab 450. The second cavity 482 may accommodate the anode tab 460. According to certain embodiments, the first cavity 481 may be a passage through which the cathode tab 450 may extend from the cathode plate 410. The cathode plate 410 and the cathode tab 450 may be integrally formed with one another. The second cavity 482 may be a passage through which the anode tab 460 may extend from the anode plate 430. The anode plate 430 and the anode tab 460 may be integrally formed with one another.

In order to increase the energy capacity of the battery, the area of the electrode plates 410 and 430 may be increased. As the area of the electrode plates 410 and 430 is increased, the electrode resistance may detrimentally increase. For example, referring to FIG. 5, when the battery is discharged, electrons in the substrate of the anode plate 530 are collected to the anode tab 550. During the process in which electrons in the substrate of the anode plate 530 travel to the anode tab 550, losses may occur due to the electrical resistance in the substrate. Accordingly, as a general principle, as the capacity of the battery increases, the area of the electrode plates 510 and 530 increases. As the area of the electrode plates 510 and 530 increases, electrode resistance increases leading to more inefficiency. This electrode resistance causes a loss of battery power, thereby reducing the utility of the battery. When the electrode resistance is sufficiently large, a voltage drop (i.e., an "IR" drop) occurs dependent upon the magnitude of current, and desirable high-rate charging or discharging characteristics of the battery may be deteriorated. According to certain embodiments disclosed herein, it is possible to provide a battery having a low electrode resistance.

FIG. 5 is a view illustrating the flow of electrons in electrode plates during charging of a battery.

Referring to FIG. 5, a battery 500 according to an embodiment may include a pouch 560, a cathode plate 510 within the pouch 560, an anode plate 530 facing the cathode plate 510, a cathode tab 540 extending to the outside of the pouch 560 from the center portion of the cathode plate 510, an anode tab 550 extending to the outside from the center portion of the anode plate 530 to the outside of the pouch 560, and a separation membrane 520 disposed between the cathode plate 510 and the anode plate 530.

The arrows in FIG. 5 may indicate the flow of electrons during charging of a battery. The electrons generated in the cathode active material are transferred to the cathode tab 540 disposed in the center portion of the cathode plate 510 through the substrate of the cathode plate 510, and the electrons transferred to the anode tab 550 provide electrons to the anode active material through the substrate of the anode plate 530. The cathode tab 540 may be electrically connected to the cathode plate 510, and the anode tab 550 may be electrically connected to the anode plate 530. The active material may not be applied to the surfaces of the cathode tab 540 and/or the anode tab 550.

The arrows indicated in FIG. 5 may indicate the flow of current during discharging of a battery. Since the moving direction of electrons is opposite to the flowing direction of current, during charging of the battery, electrons generated in the anode active material are transferred to the anode tab 550 disposed in the center portion of the anode plate 530 through the substrate of the anode plate 530, and the electrons transferred to the cathode tab 540 are transferred to the cathode active material through the substrate of the cathode plate 510.

In the battery 400 of FIGS. 4A to 4D, since the current collector tabs 450 and 460 extend inside the electrode plates 410 and 430 rather than at the edges of the electrode plates 410 and 430, it is possible to reduce the electrode resistance. For example, the battery 400 may have a structure in which current collectors are disposed in the face centers of the electrode plates 410 and 430. When the current collector tabs 450 and 460 are located in the face centers of the electrode plates 410 and 430, the sum of the paths from the unit areas of the electrode plates 410 and 430 to the current collector tabs 450 and 460 can be reduced compared to the case where the current collector tabs 450 and 460 are located at the edges of the electrode plates 410 and 430. When the sum of the paths from the unit areas of the electrode plates 410 and 430 to the current collector tabs 450 and 460 is reduced, the electrode resistance can be minimized. Since the current collector tabs 450 and 460 are disposed in the face centers so as to enable the electrode resistance to be minimized, power loss caused by the electrode resistance can be minimized. When the electrode resistance is small, battery temperature may be easily managed because heat generation in the battery 400 may also be lowered during charging or discharging.

Referring to FIGS. 6A and 6B, the ranges in which the current collector tabs are located in batteries 600a and 600b are illustrated. The current collector tabs may reduce the loss caused due to the electrode resistance by arranging the current collector tabs in an area adjacent to the face center (hereinafter referred to as a "center portion"). The center portion may be defined as a portion adjacent to the center of the surface forming a current collector tab. For example, when the shape of the electrode plates of the battery 600a is rectangular, the current collector tabs may be disposed in a region within a predetermined distance "d" from the center portion where two diagonal lines intersect. As another example, when the shape of the electrode plates of the battery 600b is circular, the current collector tabs may be disposed in a region within a predetermined distance d from the circular center portion. According to an embodiment, when the shape of the electrode plates is circular, the current collector tabs may be disposed within about ⅕ of the radius R of the electrode plate from the center portion.

When the current collector tabs are disposed outside the electrode plate, a separate space for the current collector tabs may be required. For example, when each current collector tab extends from one edge of each of the electrode plates, the overall area of the battery may be increased. When the area for accommodating the battery is limited, the area of the electrode plates is reduced due to the area occupied by the current collector tabs, and thus the battery capacity may be reduced. According to an embodiment, when the current collector tabs are disposed at the center portions of the electrode plates, a battery having a high area ratio of the electrode plates to the total area of the electrode assembly may be disposed in a space within the electronic device. The current collector tabs function as passages for transferring current generated by a chemical reaction in the battery to the electronic device, and may not have a direct relationship with the capacity of the battery. However, when the area of the electrode plates is reduced due to the area occupied by the current collector tabs, the current collector tabs may affect the capacity of the battery. By arranging the current collector tabs inside the electrode plates, it is possible to prevent the area of the electrode plates from being reduced due to the area occupied by the current collector tabs.

Referring to FIGS. 4A to 4D, when current collector tabs 450 and 460 are disposed in the center portions of the electrode plates 410 and 430, a through hole 470 may be included in the electrode plates 410 and 430. Since the current collector tabs 450 and 460 are means for electrically connecting the electrode plates 410 and 430 to an external device (e.g., a printed circuit board), the current collector tabs 450 and 460 may be exposed to the outside. By forming the through hole 470 in the centers of the electrode plates 410 and 430, the current collector tabs 450 and 460 extending from the center portions of the electrode plates 410 and 430 are exposed to the outside through the through hole 470. When the through hole 470 is formed in the center portions of the electrode plates 410 and 430, the current collector tabs 450 and 460 may extend from the inner edges of the electrode plates 410 and 430. For example, when the through hole 470 is formed in the center of the cathode plate 410, a partial region of the inner edge of the cathode substrate 412 may extend and form a cathode tab 450. The cathode tab 450 extending from a partial region of the inner edge of the cathode substrate 412 may further extend to the surface of the battery 400. When the cathode tab 450 further extends to the surface of the battery 400, the current collector tabs 450 and 460 may be seen from the outside. When the through hole 470 is formed in the center of the anode plate 430, a partial region of the inner edge of the anode substrate 432 may extend and form an anode tab 460. The anode tab 460 extending from a partial region of the inner edge of the anode substrate 432 may further extend to the surface of the battery 400.

Figure 7A:
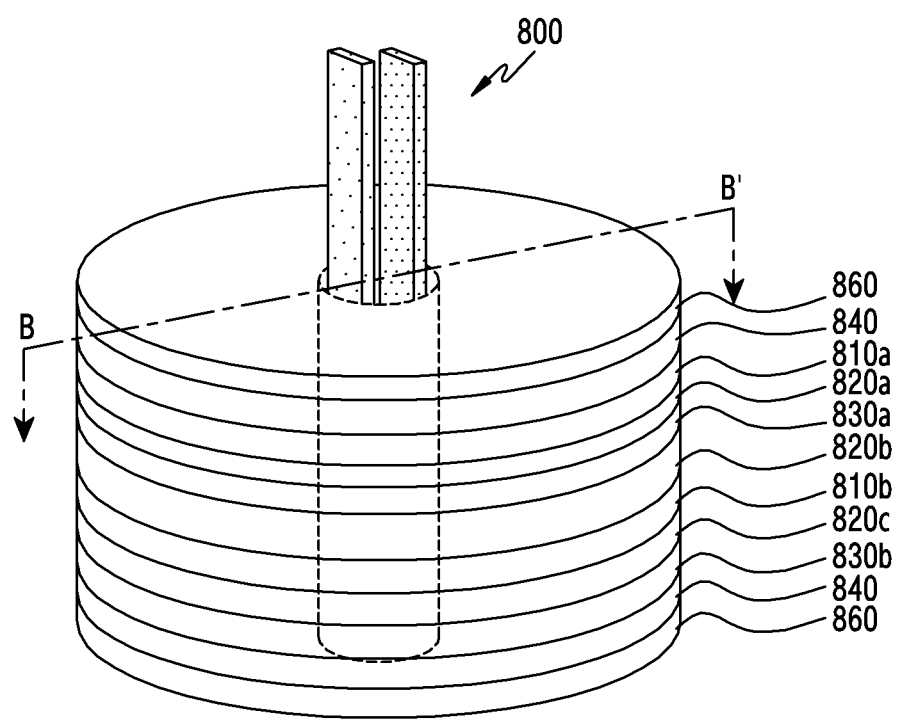
FIG. 7A illustrates a battery in which a plurality of cathode plates and a plurality of anode plates are stacked according to certain embodiments.
Figure 7B:
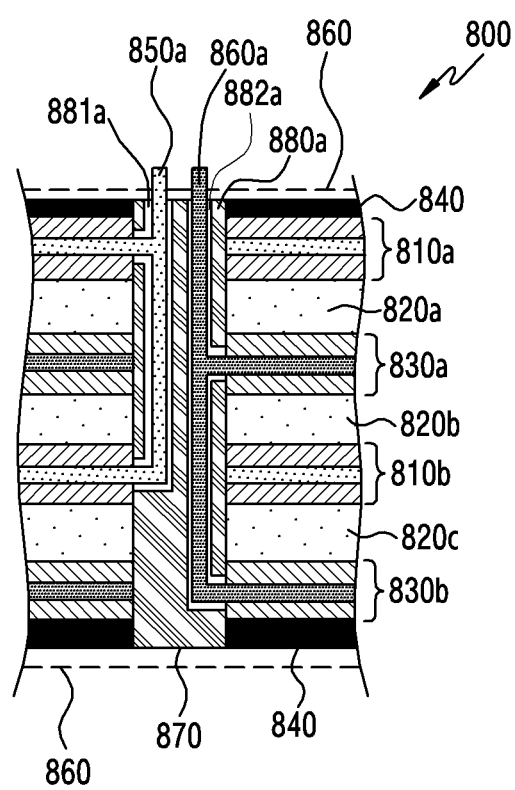
FIG. 7B is a cross-sectional view of a battery in which a plurality of anode plates and a plurality of cathode plates are stacked according to certain embodiments.
Figure 7C:
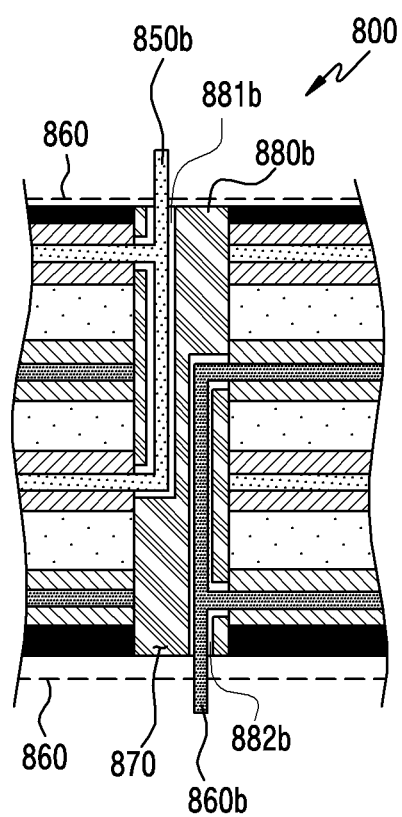
FIG. 7C is a cross-sectional view of a battery in which a cathode tab and an anode tab extend in opposite directions according to certain embodiments.

FIG. 7A illustrates a battery in which a plurality of cathode plates and a plurality of anode plates are stacked according to certain embodiments. FIG. 7B is a cross-sectional view of a battery in which a plurality of anode plates and a plurality of cathode plates are stacked according to certain embodiments. FIG. 7C is a cross-sectional view of a battery in which a cathode tab and an anode tab extend in opposite directions according to certain embodiments.

Referring to FIGS. 7A and 7B, the battery 800 may include a pouch 860, a first cathode plate 810*a* within the pouch 860, a first anode plate 830*a* facing the first cathode plate 810*a*, a second cathode plate 810*b* facing the first cathode plate 810*a* across the first anode plate 830*a*, a second anode plate 830*b* facing the first anode plate 830*a* across the second cathode plate 810*b*, a cathode tab 850*a* extending from the center portions of the first cathode plate 810*a* and the second cathode plate 810*b* to the outside of the pouch 860, an anode tab 860*a* extending from the center portions of the first anode plate 830*a* and the second anode plate 830*b* to the outside of the pouch 860, a first separation membrane 820*a* disposed between the first cathode plate 810*a* and the first anode plate 830*a*, a second separation membrane 820*b* disposed between the first anode plate 830*a* and the second cathode plate 810*b*, a third separation membrane 820*c* disposed between the second cathode plate 810*b* and the second anode plate, an alignment member 880*a*, and polymer films 840 disposed on the surfaces of the first anode plate 810*a* and the second cathode plate 830*b* facing the pouch 860. FIG. 7B shows the battery in which two cathode plates and two anode plates are alternately stacked, but three or more cathode plates and three or more anode plates may be alternately stacked.

For a battery having a high capacity, the battery 800 may include a plurality of electrode plates. A plurality of cathode plates and a plurality of anode plates may be alternately stacked with one another. The plurality of cathode plates may have a plurality of current collector tabs extending therefrom. The plurality of anode plates may have a plurality of current collector tabs extending therefrom. The plurality of current collector tabs may be combined into one tab. For example, the plurality of current collector tabs extending from the plurality of cathode plates may be combined into one cathode tab 850*a*, and the plurality of current collector tabs extending from the plurality of anode plates may be combined into one anode tab 860*a*.

In order to combine the plurality of current collector tabs into one tab, the plurality of cathode plates or the plurality of anode plates may be uniformly stacked. For example, when a cathode tab 850*a* is disposed in a specific region of a cathode plate, a plurality of cathode plates 850*a* may be stacked such that each of the plurality of cathode tabs 850*a* is disposed in a corresponding region. The region where the cathode tabs 850*a* are disposed may thus not overlap the region where the anode tabs 860*a* are disposed. According to another embodiment, the region where the cathode tabs 850*a* are disposed may overlap the region where the cathode tabs 860*a* are disposed. Since the plurality of electrode plates should be aligned such that the plurality of current collector tabs are disposed in the same region, it may not be easy to stack the plurality of electrode plates. For example, since a process of aligning the plurality of cathode plates and the plurality of anode plates along the x-axis and a process of aligning the plurality of cathode plates and the plurality of anode plates along the y-axis are required, the stacking steps may be complicated or difficult.

According to certain embodiments, the first and second cathode plates 810*a* and 810*b*, the first and second anode plates 830*a* and 830*b*, and the first, second, and third separators 820*a*, 820*b*, and 820*c* may include a pipe-shaped through hole, which is integrally formed. When the plurality of cathode plates and the plurality of anode plates are alternately stacked, the through hole 870 in the cathode plates may overlap the through hole 870 in the anode plates. When the through-hole 870 in the cathode plates does not overlap the through-hole 870 in the anode plates, a current collector tab connected to a cathode plate or an anode plate disposed in the middle of the plurality of electrode plates may not extend to the outside. Accordingly, the through hole 870 formed in the plurality of anode plates and the through hole 870 formed in the plurality of cathode plates may overlap each other. When the through hole 870 in the cathode plate and the through hole 870 in the anode plate overlap each other, the anode tab 860*a* and the cathode tab 850*a* should be disposed within the through hole 870 where the anode tab 860*a* and the cathode tab 850*a* overlap each other. Thus, the cathode tab 850*a* may be disposed close to the anode tab 860*a*. When the distance between the cathode tab 850*a* and the anode tab 860*a* is short, the cathode tab 850*a* may interfere with the anode tab 860*a*, causing an electric short circuit. The electric short circuit may cause heat generation or ignition of the battery. Accordingly, an electrical action between the cathode tab 850*a* and the anode tabs 860*a* should be prevented.

In order to prevent the cathode tab 850*a* from interfering with the anode tab 860*a*, the through holes 870 formed in the cathode plates and the anode plates may be filled with a non-conductive filler (e.g., silicon or a synthetic resin). After the cathode tab 850*a* is disposed to be spaced apart from the anode tab 860*a*, the space between the cathode tab 850*a* and the anode tab 860*a* may be filled with a filler. When the filler is disposed in the space between the cathode tab 850*a* and the anode tab 860*a*, the cathode tab 850*a* can maintain a distance from the anode tab 860*a*.

According to another embodiment, when the battery 800 includes the alignment member 880*a*, spaces separated from each other may be formed inside the alignment member 880a. In this case, the cathode tab 850a and the anode tab 860a may be disposed in the separated spaces within the alignment member 880a. Since the space accommodating the cathode tab 850a and the space accommodating the anode tab 860a are separated from each other, it is possible to prevent the cathode tab 850a from interfering with the anode tab 860a. When both the cathode tab 850a and the anode tab 860a extend from the center of the electrode plates in order to reduce the electrode resistance, the distance between the cathode tab 850a and the anode tab 860a is shortened so that the cathode tab 850a and the anode tab 860a can be connected to each other. When the cathode tab 850a and the anode tab 860a are connected, battery heat and ignition may be generated due to an electric short circuit. The alignment member 880a can physically disconnect the anode tab 860a and the cathode tab 850a, thereby preventing a problem caused by an electric short circuit. A first cavity 881a capable of accommodating the cathode tab 850a and a second cavity 882a accommodating the anode tab 860a may be formed inside the alignment member 880a. The first cavity 881a and the second cavity 882a may be formed to be separated from each other. When the first cavity 881a and the second cavity 882a are separated from each other, the cathode tab 850a and the anode tab 860a have a predetermined physical distance from each other so that the short circuit between the cathode tab 850a and the anode tab 860a can be prevented.

Referring to FIG. 7C, the cathode tab 850b and the anode tab 860b of the battery 800 may extend in opposite directions. For example, the cathode tab 850a connected to the plurality of cathode plates may be extend from the top surface of the battery 800, and the anode tab 860b connected to the plurality of anode plates may be extend from the bottom surface of the battery 800. The first cavity 881b may be capable of accommodating the cathode tab 850a and the second cavity 882b may be capable of accommodating the anode tab 860b may be formed inside the alignment member 880b. The first cavity 881b and the second cavity 882b may be formed to separate from each other.

Figure 8:
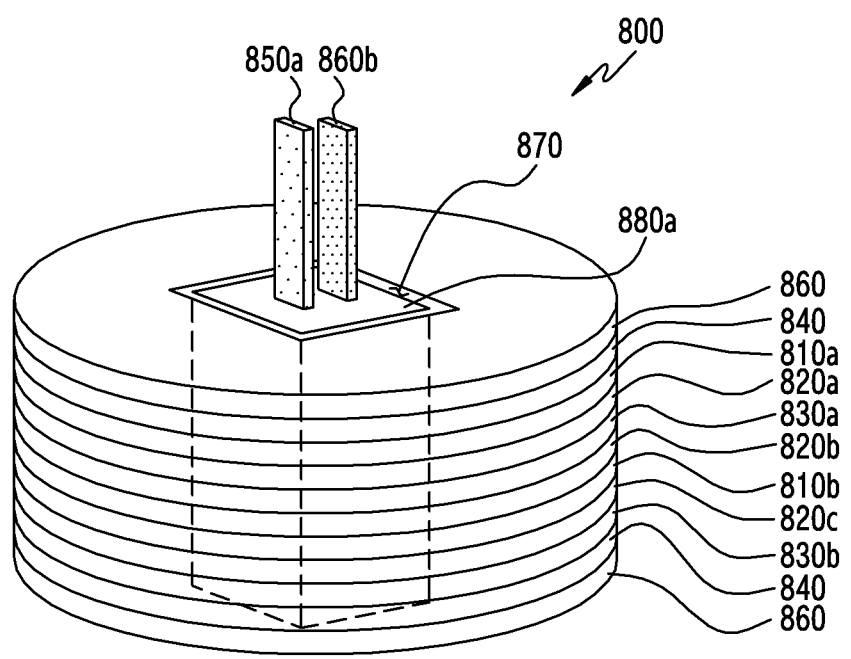
FIG. 8 is a view illustrating the shape of an alignment member included in a battery according to certain embodiments.

Referring to FIGS. 7A and 7B, when the alignment member 880a penetrating the inside of the electrode plates is used, the plurality of electrode plates may be aligned with reference to the alignment member 880a. For example, when the plurality of electrode plates have a circular shape, the plurality of electrode plates can be easily stacked when the alignment member 880a is used. In this case, a through hole 870 corresponding to the shape of the alignment member 880a may be formed in a specific region of the plurality of electrode plates. The plurality of electrode plates may be aligned with the alignment member 880a such that the alignment member 880a can be inserted into the through hole 870. The plurality of electrode plates aligned with the alignment member 880a may be stacked using the alignment member 880a. When there is no alignment member 880a, alignment along the x-axis and alignment along the y-axis are necessary, but when the alignment member 880a is used, separate alignment may not be required. Since the area of the electrode plates decreases as the size of the alignment member 880a increases, the size of the alignment member 880a may be limited in order to obtain a battery having a desired capacity. The alignment member 880a may be made of a flexible material, such as plastic, rubber, or silicone, so as to have a flexible property. The shape of the alignment member 880a may be formed to correspond to the shape of the through hole 870 formed in the battery 800. For example, referring to FIG. 8, when a through hole 870 having a quadrangular prism shape is formed in the battery 800, the alignment member 880a may have a quadrangular prism shape corresponding to the through hole 870. In FIG. 8, the alignment member 880a is illustrated as being spaced apart from the boundary of the through-hole 870. However, this is for convenience of description, and the alignment member 880a may be in contact with the through hole 870. In addition, unlike that illustrated in FIG. 8, the alignment member 880 may not be exposed to the outside of the pouch 860. According to an embodiment, when the shape of the through hole 870 and the shape of the alignment member 880a are polygonal in cross section, the process of aligning a plurality of electrode plates may be easier compared to the case where the shape of the through hole 870 and the shape of the alignment member 880a are circular in cross section. When the plurality of electrode plates have a polygonal shape, the through hole 870 for extending the plurality of current collector tabs from the electrode plates may be formed in the center portions of the plurality of electrode plates, and the through hole 870 and the alignment member 880a may have a cylindrical shape. Even if the plurality of electrode plates having a polygonal shape are stacked using the cylindrical alignment member 880a, the plurality of electrode plates may not be completely aligned. For example, it may be assumed that a plurality of electrode plates have a quadrangular shape, that a circular through hole 870 is formed in the circle centers of the electrode plates, and that the plurality of electrode plates are stacked using the cylindrical alignment member 880a. In this case, the centers of the plurality of electrode plates coincide with each other, but the edges of the plurality of electrode plates may not coincide with each other. Accordingly, additional alignment may be necessary to make the edges of the plurality of electrode plates coincide with each other. On the other hand, when using a rectangular alignment member 880a, polygonal electrode plates can also be easily stacked. For example, it may be assumed that the plurality of electrode plates have a quadrangular shape, that a circular through hole 870 is formed in the face centers of the electrode plates, and that the plurality of electrode plates are stacked using an alignment member 880a having a quadrangular prism shape. In this case, merely by stacking the plurality of electrode plates in alignment with the alignment member 880a, the plurality of electrode plates can be aligned and stacked such that the edges of the plurality of electrode plates coincide with each other. According to another embodiment, when a plurality of alignment members 880a are used, a plurality of polygonal electrode plates can also be easily aligned or stacked.

According to an embodiment, when the alignment member 880a is included in the through hole 870 in which the current collector tabs of the battery 800 are disposed, the current collector tabs may be disposed inside the alignment member 880a. The alignment member 880a may include an inner space that is capable of accommodating the current collector tabs. The alignment member 880a may include a first cavity 881a capable of accommodating the cathode tab 850a and a second cavity 882a accommodating the anode tab 860a. According to an embodiment, the first cavity 881a accommodating the cathode tab 850a may be formed to be separated from the second cavity 882a accommodating the anode tab 860a. Since the first cavity 881a and the second cavity 882a are physically separated from each other, it is possible to prevent the cathode tab 850a from interfering with the anode tab 860a. According to an embodiment, since the cathode tab 850a is connected to the plurality of cathode plates, the alignment member 880a may include a space for accommodating the portion in which the cathode plate and the cathode tab 850*a* are connected to each other. Since the anode tab 860*a* is connected to the plurality of anode tabs 860*a* like the cathode tab 850*a*, the alignment member 880*a* may include a space for accommodating the portion in which the anode plates and the anode tab 860*a* are connected to each other. For example, the first cavity 881*a* may include a first opening for accommodating a portion connecting the first cathode plates 810*a* and the cathode tab 850*a* to each other and a portion connecting the second cathode plates 810*b* and the cathode tab 850*a* to each other. The second cavity 882*a* may include a second opening for accommodating a portion connecting the first anode plates 830*a* and the anode tab 860*a* to each other and a portion connecting the second anode plates 830*b* and the anode tab 860*a* to each other. By physically separating the cathode tab 850*a* and the anode tab 860*a* using the alignment member 880*a*, it is possible to prevent an electric short circuit between the cathode tab 850*a* and the anode tab 860*a*.

Figure 9:
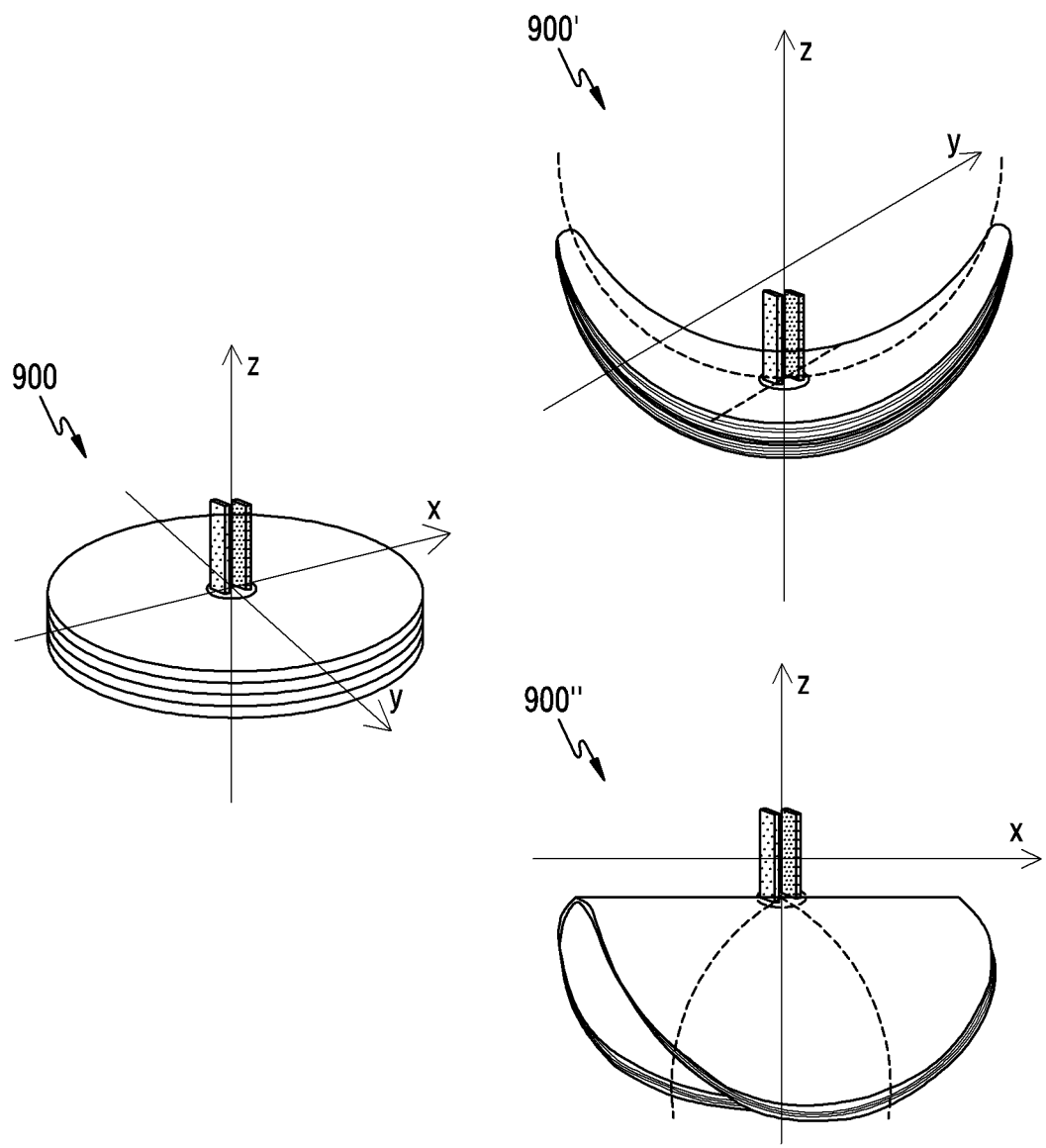
FIG. 9 illustrates the case in which bidirectional deformation occurs in a battery in which a current collector is disposed in the center portion of an electrode plate according to certain embodiments.

FIG. 9 illustrates the case in which bidirectional deformation occurs in a battery in which a current collector is disposed in the center portions of electrode plates. Referring to FIG. 9, when the current collector tabs are disposed in the center portions of the electrode plates, flexibility of the battery 900 can be improved. When the current collector tabs are located at the edges of the electrode plates, a plurality of current collector tabs extending from the plurality of electrode plates may be combined into one current collector tab. The plurality of current collector tabs may be coupled to each other by adhesive so as to form a single current collector tab. When a battery including a plurality of electrode plates and a current collector tab disposed on an edge of the electrode plate is bent, a relative movement between the plurality of electrode plates and the plurality of separation membranes may be increased as the distance from the current collector tab is increased. When the battery 900 is bent, a relative shear movement between the cathode plates and the separation membranes at a point distant from the current collector tab may be large. On the other hand, the relative shear motion between the cathode plates and the separation members at a point close to the current collector tab may be small. When the battery is subjected to repeated bending stress, due to a relative shear movement between a plurality of neighboring electrode plates and separation membranes, the plurality of electrode plates or the plurality of separation membranes may be damaged. For example, the separation membranes may be damaged, resulting in an electrical short circuit between the cathode plates and the anode plates, and the battery may be ignited due to the electrical short circuit.

When the current collector tabs are disposed in the center portions of the electrode plates, the distance from the edges of the electrode plates to the region where the current collector tabs are disposed becomes short. Thus, the battery can have relatively high durability against bending. For example, the battery 900 in which the current collector tab is disposed at the edge of the same electrode plate may have lower durability against bending than the battery in which the current collector tab is disposed in the circle center. Even if the same degree of bending is applied, the shear stress generated between the electrode plates in the region farthest from the location where the current collector is disposed may be larger in the battery in which the current collector tab is disposed at the edge than in the battery 900 in which the current collector tab is disposed at the circle center. When the current collector tab is disposed in the circle center, the battery may have uniform flexibility depending on the bending direction. The battery may have high flexibility both the case where the battery is bent with respect to the x axis parallel to the cathode plate (e.g., bent along the y axis such that the battery is no longer flat with respect to the x axis, as seen in 900') and the case where the battery is bent with respect to the y axis parallel to the cathode plate and different from the x axis (e.g., bent along the x axis such that the battery is no longer flat with respect to the y axis, as seen in 900").

A battery (e.g., the battery 400 in FIG. 4B) according to certain embodiments described above may include: a first cathode plate (e.g., the cathode plate 410 in FIG. 4B) including a first surface oriented in a first direction and a second surface oriented in a second direction opposite to the first direction; a separation membrane (e.g., the separation membrane 420 in FIG. 4B) disposed on the second surface of the first cathode plate; a first anode plate (e.g., the anode plate 430 in FIG. 4B) disposed on a surface of the separation membrane oriented in the second direction; a through hole (e.g., the through hole 470 in FIG. 4B) formed adjacent to center portions of the first cathode plate, the first separation membrane, and the first anode plate, wherein the through hole is substantially perpendicular to the first cathode plate; a cathode tab (e.g., the cathode tab 450 in FIG. 4B) disposed within the through hole and electrically connected to the first cathode plate; and an anode tab (e.g., the anode tab 460 in FIG. 4B) spaced apart from the cathode plate within the through hole and electrically connected to the first anode plate, wherein the cathode tab and the anode tab may be at least partially visible to the outside through the through hole.

According to an embodiment, the first cathode plate may include a first substrate (e.g., the cathode substrate 412 in FIG. 4B) and a cathode active material (e.g., the cathode active material 411 in FIG. 4B) formed on opposite surfaces of the first substrate, and the first anode plate includes a second substrate (e.g., the anode substrate 432 in FIG. 4B) and an anode active material (e.g., the anode active material 431 in FIG. 4B) formed on opposite surfaces of the second substrate.

According to an embodiment, the battery may further include: an alignment member disposed in the first through hole, and including a first cavity (e.g., the first cavity 481 in FIG. 4C) configured to accommodate the cathode tab therein and a second cavity (e.g., the second cavity 482 in FIG. 4C) separated from the first cavity and configured to accommodate the cathode tab, wherein the alignment member may have a shape corresponding to a shape of the through hole, the first cavity may include a first opening configured to accommodate a portion that connects the first substrate and the cathode tab to each other, and the second cavity includes a second opening configured to accommodate a portion that connects the second substrate and the anode tab to each other.

According to an embodiment, the alignment member may be formed of a flexible material.

According to an embodiment, the through hole and the alignment member may have a cylindrical shape or a quadrangular prism shape.

According to an embodiment, the battery may have a polygonal shape, and the center portion may be a region within a designated distance with reference to a face center of the battery.

According to an embodiment, the battery may have a circular shape, and the center portion may be a region within a designated distance with reference to a circle center of the battery.

According to an embodiment, the designated distance may be ⅕ of the radius of the battery.

According to an embodiment, the cathode tab may be visible to the outside in the first direction, and the anode tab may be visible to the outside in the second direction.

According to an embodiment, the battery may further include a metal alloy can enclosing the battery, wherein the metal alloy can may be electrically connected to the cathode tab or the anode tab.

According to an embodiment, the battery may further include a polymer layer laminated on each of opposite surfaces of the battery.

According to an embodiment, the battery may be deformable about a first axis that is perpendicular to an axis passing through the through hole, and may be deformable about a second axis that is different from the first axis that is perpendicular to the axis passing through the through hole.

According to an embodiment, the battery may further include: a second separation membrane (e.g., the second separation membrane 820b in FIG. 8B) disposed on the surface of the first anode plate oriented in the second direction; a second cathode plate (e.g., the second cathode plate 810b in FIG. 8B) disposed on the surface of the second separation membrane oriented in the second direction; a third separation membrane (e.g., the third separation membrane 820c in FIG. 8B) disposed on the surface of the second cathode plate oriented in the second direction; and a second anode plate (e.g., the second anode plate 830b in FIG. 8B) disposed on a surface of the third separation membrane oriented in the second direction, wherein the through hole may be formed adjacent to center portions of the second cathode plate, the second separation membrane, the third separation membrane, and the second anode plate, the cathode tab may be electrically connected to the second cathode plate, and the anode tab may be electrically connected to the second anode plate.

According to an embodiment, a battery may include: a first cathode plate including a first surface oriented in a first direction and a second surface oriented in a second direction opposite to the first direction; a separation membrane disposed on the second surface of the first cathode plate; a first anode plate disposed on a surface of the separation membrane oriented in the second direction; a cathode tab extending from a portion of the first cathode plate in the first direction; and an anode tab extending from a portion of the first anode plate in the first direction, wherein the cathode tab and the anode tab may be at least partially visible to the outside.

According to an embodiment, an electronic device (e.g., the electronic device 100 in FIG. 1) may include: a housing (e.g., the housing 310 in FIG. 3); a printed circuit board disposed within the housing, and including a first surface oriented in a first direction and a second surface oriented in a second direction opposite to the first direction; a first cathode plate disposed on the second surface of the printed circuit board; a first separation membrane disposed on the surface of the first cathode plate oriented in the second direction; a first anode plate disposed on a surface of the first separation membrane oriented in the second direction; and a through hole formed adjacent to center portions of the first cathode plate, the first separation membrane, and the first anode plate, wherein the through hole is substantially perpendicular to the first cathode plate; a first cathode tab extending from the center portion of the first cathode plate through the through hole in a direction substantially perpendicular to the first cathode plate; and a first anode tab extending from the center portion of the first anode plate through the through hole in a direction substantially perpendicular to the first anode plate, wherein the cathode tab and the anode tab may be at least partially visible to the outside through the through hole.

According to an embodiment, the electronic device may further include an alignment member disposed in the through hole and including a first cavity configured to accommodate the cathode tab therein and a second cavity separated from the first cavity and configured to accommodate the cathode tab, wherein the alignment member may have a shape corresponding to the shape of the through hole, the first cavity may include a first opening configured to accommodate a conductive member that connects the first substrate and the cathode tab to each other, and the second cavity includes a second opening configured to accommodate a conductive member that connects the second substrate and the anode tab to each other.

According to an embodiment, in the electronic device, the alignment member may be formed of a flexible material.

According to an embodiment, in the electronic device, the battery may have a polygonal shape, and the center portion may be a region within a designated distance with reference to a face center of the battery.

According to an embodiment, in the electronic device, the battery may have a circular shape, and the center portion may be a region within a designated distance with reference to a circle center of the battery.

According to an embodiment, in the electronic device, the battery may have a circular shape, and the center portion may be a region within a designated distance with reference to a circle center of the battery.

According to an embodiment, the electronic device may further include: a second separation membrane disposed on the surface of the first anode plate oriented in the second direction; a second cathode plate disposed on the surface of the second separation membrane oriented in the second direction; a third separation membrane disposed on the surface of the second cathode plate oriented in the second direction; and a second anode plate disposed on a surface of the third separation membrane oriented in the second direction, wherein the through hole may be formed adjacent to center portions of the second cathode plate, the second separation membrane, the third separation membrane, and the second anode plate, the cathode tab may be electrically connected to the second cathode plate, and the anode tab may be electrically connected to the second anode plate.

According to an embodiment, the electronic device may be a wearable device.

The electronic device according to certain embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that certain embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Certain embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to certain embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to certain embodiments, each component (e.g., a module or a program) of the above-described components may include a single entity or multiple entities. According to certain embodiments, one or more of the above-described components may be omitted, or one or more other components may be added. Alternatively or additionally, a plurality of components (e.g., modules or programs) may be integrated into a single component. In such a case, according to certain embodiments, the integrated component may still perform one or more functions of each of the plurality of components in the same or similar manner as they are performed by a corresponding one of the plurality of components before the integration. According to certain embodiments, operations performed by the module, the program, or another component may be carried out sequentially, in parallel, repeatedly, or heuristically, or one or more of the operations may be executed in a different order or omitted, or one or more other operations may be added.

What is claimed is:

1. A battery, comprising:
    a first cathode plate including a first surface oriented in a first direction, and a second surface oriented in a second direction opposite to the first direction;
    a first separation membrane disposed on the second surface of the first cathode plate;
    a first anode plate disposed on a surface of the first separation membrane oriented in the second direction;
    a through hole formed adjacent to respective center portions of the first cathode plate, the first separation membrane, and the first anode plate, wherein the through hole is substantially perpendicular to one surface of the first cathode plate;
    a cathode tab disposed within the through hole and electrically connected to the first cathode plate;
    an anode tab spaced apart from the first cathode plate within the through hole and electrically connected to the first anode plate; and
    an alignment member disposed in the through hole, and including a first cavity configured to accommodate the cathode tab therein, and a second cavity separated from the first cavity and configured to accommodate the anode tab,
    wherein the alignment member is formed of a flexible material including at least one of plastic, rubber or silicone,
    wherein the through hole and the alignment member have a quadrangular prism shape, and
    wherein the cathode tab and the anode tab are at least partially exposed to an external environment through the through hole.

2. The battery of claim 1, wherein the first cathode plate includes a first substrate and a cathode active material formed on opposite surfaces of the first substrate, and the first anode plate includes a second substrate and an anode active material formed on opposite surfaces of the second substrate.

3. The battery of claim 2,
    wherein the first cavity includes a first opening configured to accommodate a first portion connecting the first substrate to the cathode tab, and
    wherein the second cavity includes a second opening configured to accommodate a second portion connecting the second substrate to the anode tab.

4. The battery of claim 1, wherein the battery has a polygonal shape or a circular shape, and the respective center portion is disposed within a designated distance from a face center of the battery.

5. The battery of claim 4, wherein the battery has a circular shape, and
    the designated distance is $\frac{1}{5}$ of a radius of the battery.

6. The battery of claim 1, wherein the cathode tab is visible to the external environment in the first direction, and the anode tab is visible to the external environment in the second direction.

7. The battery of claim 1, further comprising:
a metal alloy can enclosing the battery,
wherein the metal alloy can is electrically connected to the cathode tab or the anode tab.

8. The battery of claim 1, further comprising:
a polymer layer laminated on opposite surfaces of the battery.

9. The battery of claim 1, further comprising:
a second separation membrane disposed on the surface of the first anode plate oriented in the second direction;
a second cathode plate disposed on the surface of the second separation membrane oriented in the second direction;
a third separation membrane disposed on the surface of the second cathode plate oriented in the second direction; and
a second anode plate disposed on a surface of the third separation membrane oriented in the second direction,
wherein the through hole is formed adjacent to center portions of the second cathode plate, the second separation membrane, the third separation membrane, and the second anode plate, and
wherein the cathode tab is electrically connected to the second cathode plate, and the anode tab is electrically connected to the second anode plate.

10. A battery, comprising:
a first cathode plate including a first surface oriented in a first direction and a second surface oriented in a second direction opposite to the first direction;
a separation membrane disposed on the second surface of the first cathode plate;
a first anode plate disposed on a surface of the separation membrane oriented in the second direction;
a cathode tab extending from a portion of the first cathode plate in the first direction; and
an anode tab extending from a portion of the first anode plate in the first direction,
wherein the cathode tab and the anode tab are at least partially exposed to an external environment, and
wherein a space between the cathode tab and the anode tab is filled with a non-conductive filter.

* * * * *